(12) United States Patent
Ogawa et al.

(10) Patent No.: US 11,613,811 B2
(45) Date of Patent: Mar. 28, 2023

(54) FILM FORMING APPARATUS AND METHOD OF OPERATING FILM FORMING APPARATUS

(71) Applicant: Tokyo Electron Limited, Tokyo (JP)

(72) Inventors: Jun Ogawa, Nirasaki (JP); Hiroyuki Wada, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 136 days.

(21) Appl. No.: 17/027,409

(22) Filed: Sep. 21, 2020

(65) Prior Publication Data

US 2021/0095375 A1    Apr. 1, 2021

(30) Foreign Application Priority Data

Sep. 27, 2019    (JP) .............................. JP2019-177576

(51) Int. Cl.
| | | |
|---|---|---|
| *C23C 16/458* | (2006.01) | |
| *C23C 16/455* | (2006.01) | |
| *C23C 16/452* | (2006.01) | |
| *C23C 16/44* | (2006.01) | |
| *C23C 16/52* | (2006.01) | |
| *C23C 16/34* | (2006.01) | |

(52) U.S. Cl.
CPC ...... *C23C 16/45527* (2013.01); *C23C 16/345* (2013.01); *C23C 16/4412* (2013.01); *C23C 16/452* (2013.01); *C23C 16/4584* (2013.01); *C23C 16/45553* (2013.01); *C23C 16/52* (2013.01)

(58) Field of Classification Search
CPC .............. C23C 16/452; C23C 16/4405; C23C 16/45553; C23C 16/45527; C23C 16/45551; C23C 16/4412; C23C 16/52; C23C 16/4584; C23C 16/45574
See application file for complete search history.

(56) References Cited

U.S. PATENT DOCUMENTS

| | | | |
|---|---|---|---|
| 2002/0106909 A1* | 8/2002 | Kato .................... | C23C 16/345 438/791 |
| 2004/0168768 A1* | 9/2004 | Nozawa ............ | H01J 37/32834 156/345.29 |

(Continued)

FOREIGN PATENT DOCUMENTS

| | | |
|---|---|---|
| JP | 2002334869 A | 11/2002 |
| JP | 2019033229 A | 2/2019 |

*Primary Examiner* — Joseph A Miller, Jr.
(74) *Attorney, Agent, or Firm* — Nath, Goldberg & Meyer; Jerald L. Meyer; Tanya E. Harkins

(57) ABSTRACT

A film forming apparatus sequentially supplies a raw material gas of a compound containing chlorine and an element other than the chlorine, and a first reaction to form a fil. The film forming apparatus includes a rotary table, a raw material gas ejection port configured to eject the raw material gas to a first region, a reaction gas supply part configured to supply, to a second region, a first reaction gas and a second reaction gas that reacts with chlorine to generate a third reaction product, in order to prevent a second reaction product from being generated due to a reaction of the chlorine remaining in the vacuum container with air when performing the opening-to-air. The film forming apparatus further includes an atmosphere separation part, a first exhaust port and a second exhaust port, and a controller.

9 Claims, 8 Drawing Sheets

(56) References Cited

U.S. PATENT DOCUMENTS

2006/0137709 A1* 6/2006 Tamura ................ C23C 16/401
　　　　　　　　　　　　　　　　　　　　134/1
2013/0337635 A1* 12/2013 Yamawaku ....... H01L 21/02164
　　　　　　　　　　　　　　　　　　　　118/723 ER
2019/0051512 A1* 2/2019 Kato ................ H01L 21/02274

* cited by examiner

FILM FORMING APPARATUS AND METHOD OF OPERATING FILM FORMING APPARATUS

CROSS-REFERENCE TO RELATED APPLICATION

This application is based upon and claims the benefit of priority from Japanese Patent Application No. 2019-177576, filed on Sep. 27, 2019, the entire contents of which are incorporated herein by reference.

TECHNICAL FIELD

The present disclosure relates to a film forming apparatus and a method of operating the same.

BACKGROUND

In a process of manufacturing a semiconductor device, for example, an $Si_3N_4$ (hereinafter, referred to as "silicon nitride" or "SiN") film is formed on a semiconductor wafer (hereinafter, referred to as a "wafer"), which is a substrate, using a raw material gas composed of a compound containing chlorine and an element other than chlorine. This film forming process is performed by a method called, for example, atomic layer deposition (ALD), in which a raw material gas and a reaction gas are alternately supplied to the wafer multiple times. As a film forming apparatus for performing ALD, for example, as illustrated in Patent Document 1, there is known an apparatus in which wafers are placed on a rotary table provided within a vacuum container and which is configured such that a wafer revolving by rotation of the rotary table repeatedly passes through a processing region configured as an atmosphere to which a raw material gas is supplied and a processing region configured as an atmosphere to which a reaction gas is supplied. In addition to the raw material gas atmosphere and the reaction gas atmosphere, a predetermined region is formed in which a modifying gas for modifying a film is supplied on the rotary table so that each of the reaction gas and the modifying gas is supplied.

Patent Document 2 discloses a technique for suppressing generation of hydrochloric acid in a maintenance work by supplying ammonia into a reaction tube to react with chlorine to generate ammonium chloride in a thermal processing apparatus for forming a silicon nitride film on a substrate.

PRIOR ART DOCUMENT

Patent Document (Patent Document 1) Japanese Laid-Open Patent Publication No. 2019-33229
(Patent Document 2) Japanese Laid-Open Patent Publication No. 2002-334869

SUMMARY

According to embodiments of the present disclosure, there is provided a film forming apparatus that performs a cycle for sequentially supplying, to a substrate, a raw material gas, which is a compound containing chlorine and an element other than the chlorine, and a first reaction gas that reacts with the raw material gas so as to generate a first reaction product containing the element other than the chlorine, multiple times so as to form a film of the first reaction product, the film forming apparatus including: a rotary table configured to rotate so as to make the substrate revolve within a vacuum container configured to allow opening-to-air for opening an inside thereof to an air atmosphere; a raw material gas ejection port configured to eject the raw material gas to a first region on the rotary table; a reaction gas supply part configured to supply, to a second region spaced apart from the first region in a circumferential direction of the rotary table, each of the first reaction gas and a second reaction gas that reacts with chlorine to generate a third reaction product, in order to prevent a second reaction product from being generated due to a reaction of the chlorine remaining in the vacuum container with air when performing the opening-to-air; an atmosphere separation part configured to separate an atmosphere of the first region and an atmosphere of the second region when forming the film; a first exhaust port and a second exhaust port configured to exhaust only the atmosphere of the first region and the atmosphere of the second region, respectively, when forming the film; and a controller configured to output a control signal for executing: a film forming process of forming the film on the substrate by performing each of supply of the raw material gas and supply of the first reaction gas to the first region and the second region, respectively; and a pre-processing process performed before the opening-to-air so as to form a flow of the second reaction gas directed from the second region to the first exhaust port by performing exhaust from at least the first exhaust port among the first exhaust port and the second exhaust port and supplying the second reaction gas to the second region, in a state in which the supply of the raw material gas to the first region is stopped after the film forming process.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
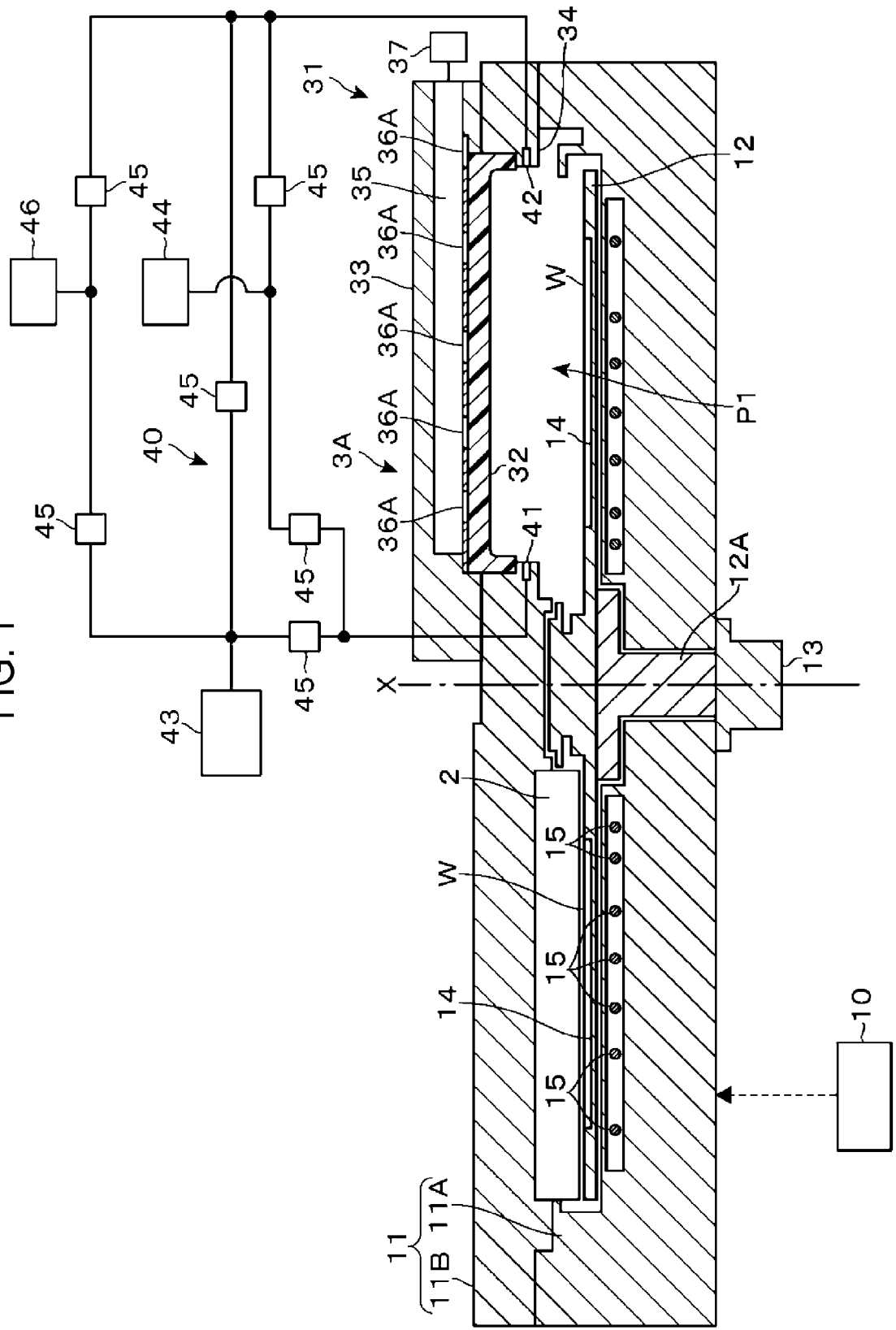
FIG. 1 is a vertical cross-sectional view illustrating an exemplary film forming apparatus according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A film forming apparatus according to an embodiment of the present disclosure will be described with reference to a vertical cross-sectional view of FIG. 1 and a horizontal cross-sectional view of FIG. 2. This film forming apparatus is configured to form, through atomic layer deposition (ALD), a silicon nitride film (SiN film) on the surface of a semiconductor wafer (hereinafter referred to as a "wafer") W, which is a substrate. In the film forming apparatus of this example, dichlorosilane (DCS: $SiH_2Cl_2$) gas is used as a raw material gas, which is a compound composed of chlorine and an element other than chlorine. Then, as a first reaction gas that reacts with the DCS gas to generate SiN which is a first reaction product containing an element other than chlorine (Cl), plasmatized ammonia ($NH_3$) gas is used, and the DCS and the plasmatized $NH_3$ gas react to form a SiN film on the wafer W. In the specification, silicon nitride is referred to as SiN regardless of the stoichiometric ratio of Si and N. Thus, the description "SiN" includes, for example, $Si_3N_4$.

The film forming apparatus 1 includes a flat and substantially circular vacuum container 11, and the vacuum container 11 includes a container body 11A having a side wall and a bottom, and a ceiling plate 11B configured to be detachable from the container body 11A. A circular rotary table 12, on which wafers W each having a diameter of 300 mm are placed, is provided in the vacuum container 11. In the drawing, reference numeral 12A denotes a support that supports the central portion of the rear surface of the rotary table 12. A rotation mechanism 13 is provided below the support 12A, and the rotary table 12 rotates in the clockwise direction, when viewed from above, about a vertical axis via the support 12A during the film forming process. Symbol X in the drawing denotes the rotary axis of the rotary table 12.

Figure 2:
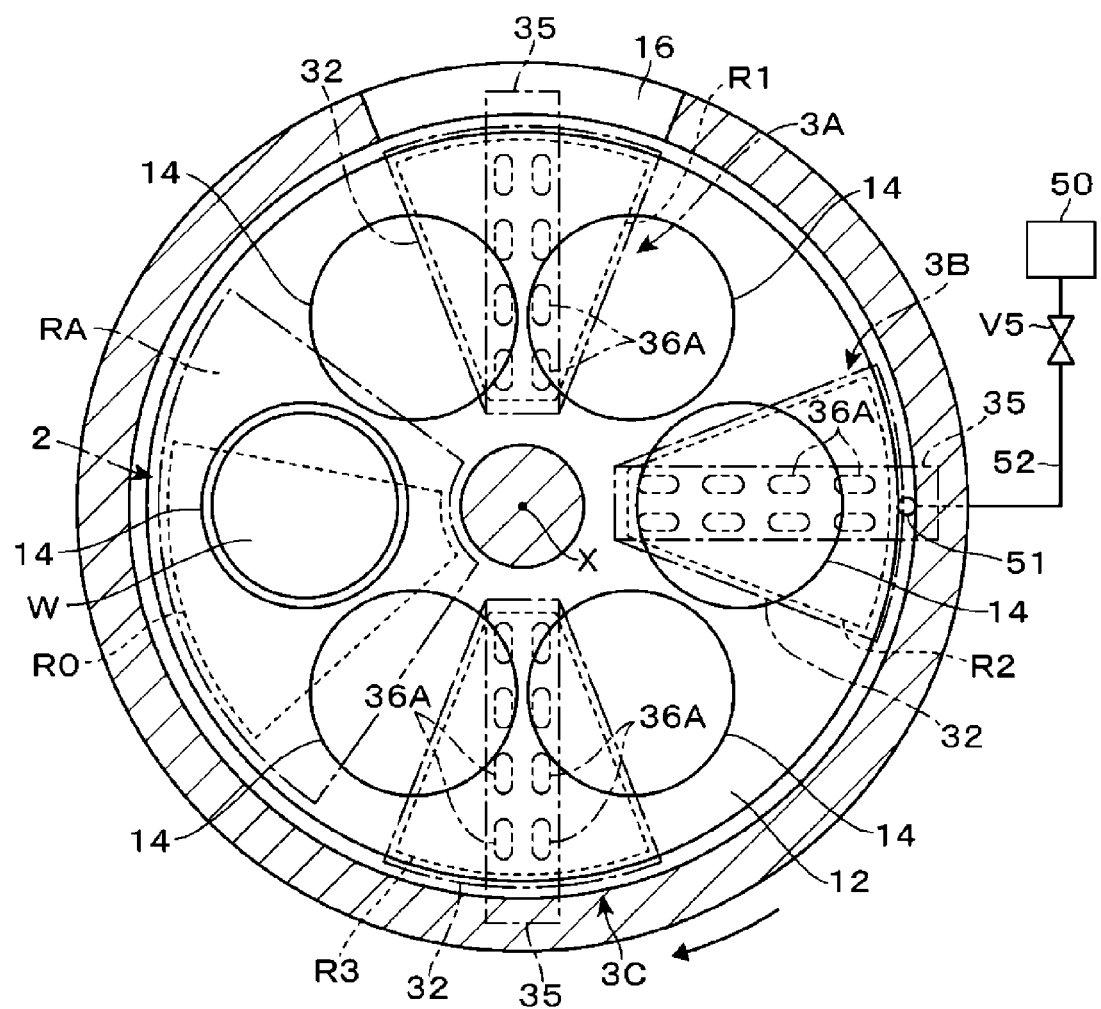
FIG. 2 is a horizontal cross-sectional view of the exemplary film forming apparatus.

As illustrated in FIG. 2, six circular recesses 14, which are placement portions of wafers W, are provided in the top surface of the rotary table 12 along the circumferential direction (rotation direction) of the rotary table 12, and a wafer W is accommodated in each recess 14. That is, each wafer W is placed on the rotary table 12 so as to revolve by the rotation of the rotary table 12. Returning to FIG. 1, a plurality of concentric heaters 15 are provided below the rotary table 12 in the bottom portion of the vacuum container 11 so that the wafers W placed on the rotary table 12 are heated. In addition, as illustrated in FIG. 2, a transport port 16 of wafers W opens in the side wall of the vacuum container 11, and is configured to be openable/closable by a gate valve (not illustrated). The vacuum container 11 is connected, through the transport port 16, to a vacuum transport chamber having a vacuum atmosphere.

The position facing the transport port 16 in the vacuum container 11 is set to a delivery position of a wafer W, and delivery lifting pins (not illustrated) for lifting a wafer W from the rear surface thereof through each of the recesses 14 and a lifting mechanism (not illustrated) for the lifting pins are provided below the rotary table 12 in the portion corresponding to the delivery position. A wafer W is transported to the delivery position through the transport port 16 by a substrate transport mechanism (not illustrated) provided in the vacuum transport chamber, and is delivered to a recess 14 by the cooperation of the substrate transport mechanism and the lifting pins. In addition, the vacuum container 11 is provided with a temperature measurement part (not illustrated) for measuring a temperature within the vacuum container 11.

As illustrated in FIG. 2, a gas supply and exhaust unit 2 and plasma forming units 3A to 3C are provided in that order in the clockwise direction above the rotary table 12. The gas supply and exhaust unit 2 will be described with reference to the vertical cross-sectional view of FIG. 3 and the bottom view of FIG. 4. When viewed in a plan view, the gas supply and exhaust unit 2 is formed in a fan shape that widens in the circumferential direction of the rotary table 12 from the center side toward the peripheral side of the rotary table 12, and the bottom surface of the gas supply and exhaust unit 2 is close to and faces the top surface of the rotary table 12.

The gas supply and exhaust unit 2 is made of, for example, aluminum, and has gas ejection ports 21, a first exhaust port 22, and a purge gas ejection port 23, which open in the bottom surface thereof. To facilitate identification in the drawings, in FIG. 4, a large number of dots are drawn in the first exhaust port 22 and the purge gas ejection port 23. A large number of gas ejection ports 21 are arranged in a fan-shaped region 24 inside the peripheral portion of the bottom surface of the gas supply and exhaust unit 2. The gas ejection ports 21 eject the DCS gas downwards in a shower form during the rotation of the rotary table 12 in the film forming process so as to supply the DCS gas to the entire surface of the wafer W.

In the fan-shaped region 24, a gas flow passage 25 is provided inside the gas supply and exhaust unit 2 so that the DCS gas can be supplied to each gas ejection port 21. The upstream sides of the gas flow passages 25 are connected to a DCS gas supply source 26 via pipes 201 made of a metal, such as stainless steel, and a flow rate adjustment part M201 including a mass flow controller and a valve V201 are interposed in each pipe. Alternatively, a purge gas supply source 27 is connected to the pipes 201 via a purge gas supply pipe 203, and the pipes 201 are configured to switch the gas ejected from each gas ejection port 21 between the DCS gas and the purge gas, such as Ar gas. Reference numeral V29 in FIG. 3 denotes a valve.

Next, the first exhaust port 22 and the purge gas ejection port 23 will be described. The first exhaust port 22 is an annular groove that surrounds the fan-shaped region 24 (see FIG. 4), and the purge gas ejection port 23 is configured as an annular groove in the peripheral portion of the bottom surface of the gas supply and exhaust unit 2. The first exhaust port 22 and the purge gas ejection port 23 open to face the top surface of the rotary table 12. The purge gas ejection port 23 ejects, for example, argon (Ar) gas, onto the rotary table 12 as a purge gas. The region inside the exhaust port 22 on the rotary table 12 forms an adsorption region R0, which is a first region in which the DCS gas is adsorbed to the wafer W. The purge gas ejection port 23 corresponds to an atmosphere separation part that separates the atmosphere of the adsorption region R0 and the atmosphere of processing regions R1 to R3 to be described later. Further, a surrounding region RA is formed around the adsorption region R0 on the rotary table 12. The inner edge of the surrounding region RA is evacuated by the first exhaust port 22, and purge gas ejected from the purge gas ejection port 23 is sprayed to the outer edge of the surrounding region RA. The DCS gas supplied to the adsorption area R0 may be suppressed from being supplied to the outside beyond the surrounding region RA by the surrounding region RA.

Figure 3:
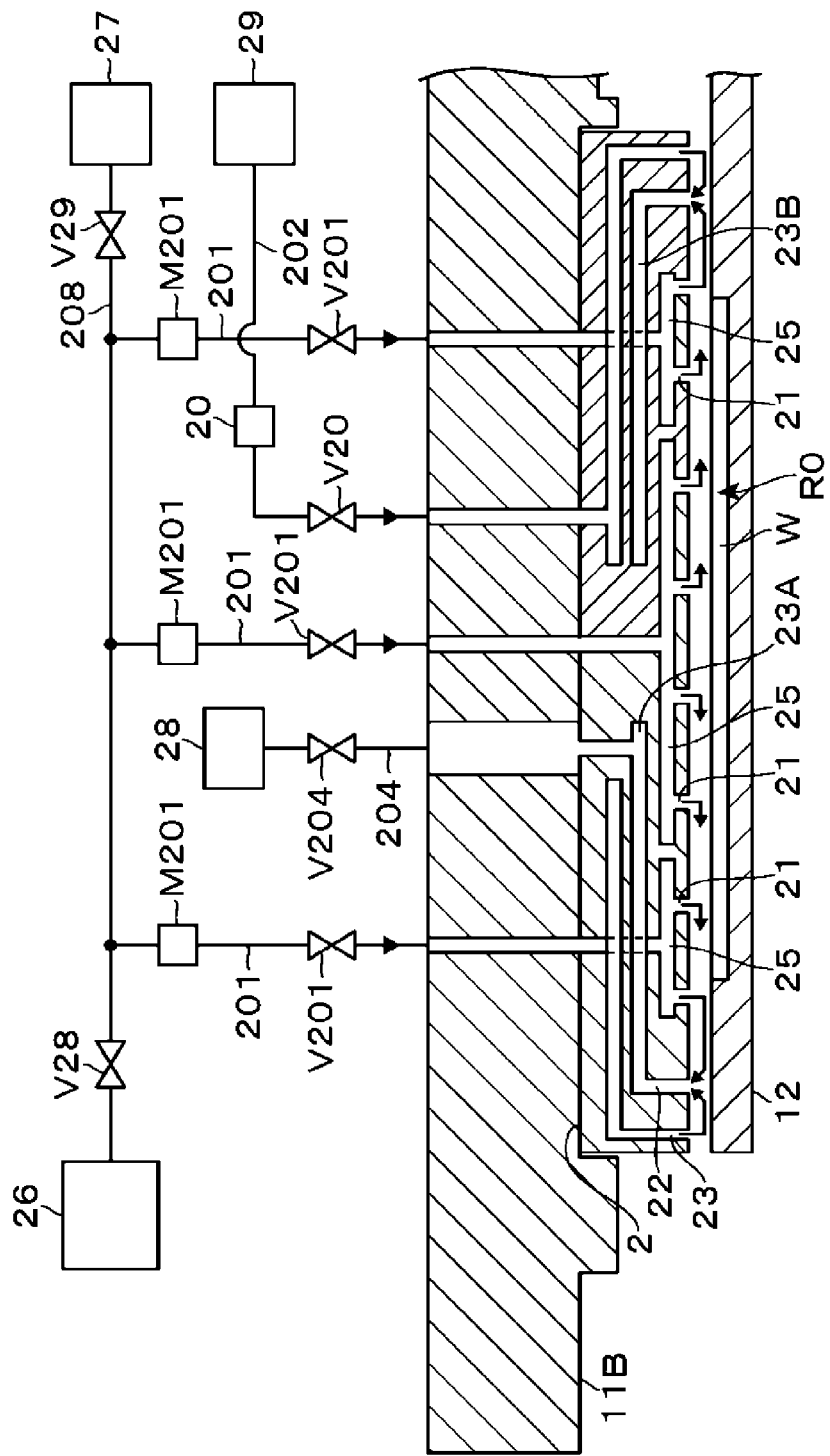
FIG. 3 is a vertical cross-sectional view illustrating an exemplary gas supply and exhaust unit provided in the film forming apparatus.
Figure 4:
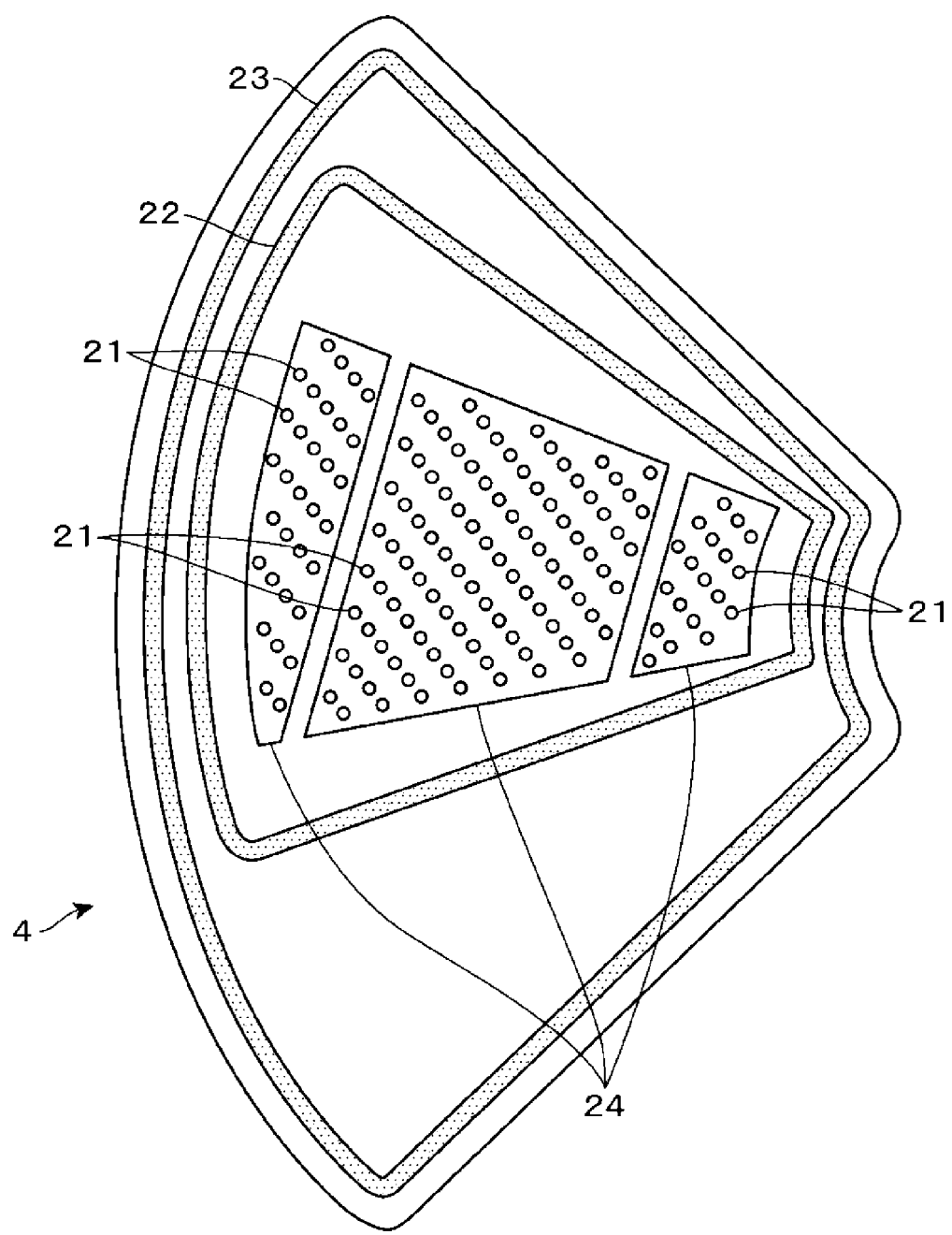
FIG. 4 is a bottom view illustrating the exemplary gas supply and exhaust unit.

Reference numerals 23A and 23B in FIG. 3 denote gas flow paths that are provided in the gas supply and exhaust unit 2 to be partitioned from each other. An upstream end of the gas flow path 23A is connected to the exhaust port 22, and a downstream end of the gas flow path 23A is connected to the exhaust apparatus 28 through, for example, an exhaust pipe 204, which is made of stainless steel and is provided with a valve V204. Thus, exhaust can be performed from the first exhaust port 22 by the exhaust apparatus 28. A downstream end of the gas flow path 23B is connected to the purge gas ejection port 23, and an upstream end of the gas flow path 23B is connected to the Ar gas supply source 29, through, for example, a pipe 202 made of stainless steel. The pipe 202 is provided with a flow rate adjustment part 20 and a valve V20.

During film formation, ejection of the raw material gas from the gas ejection ports 21, exhaust from the exhaust port 22, and ejection of the purge gas from the purge gas ejection port 23 are performed together. As a result, as indicated by the arrows, the raw material gas and the purge gas ejected toward the rotary table 12 are exhausted from the first exhaust port 22 in the state in which the top surface of the rotary table 12 faces the first exhaust port 22. By performing ejection and exhaust of the purge gas in this manner, the atmosphere in the adsorption region R0 can be separated by the purge gas supplied from the purge gas ejection port 23, and the raw material gas can be supplied to the adsorption region R0 in a limited manner.

Next, plasma forming units 3A to 3C will be described. Since the plasma forming units 3A to 3C have substantially the same configuration, the plasma forming unit 3A will be described here. The plasma forming unit 3A is formed in a substantially fan shape that widens from the center side toward the peripheral side of the rotary table 12. As illustrated in FIG. 1, the plasma forming unit 3A includes an antenna 31 for supplying microwaves, and the antenna 31 includes a dielectric plate 32 and a metal waveguide 33.

The waveguide 33 is provided on the dielectric plate 32 and includes an inner space 35 extending in the radial direction of the rotary table 12. On the lower side of the waveguide 33, a slot plate including a plurality of slot holes 36A is provided so as to come in contact with the dielectric plate 32. A microwave generator 37 is connected to the waveguide 33, and supplies microwaves of, for example, about 2.45 GHz to the waveguide 33.

The plasma forming unit 3A includes a gas ejection hole 41 and a gas ejection hole 42, each of which supplies a plasma forming gas to the bottom surface side of the dielectric plate 32. The gas ejection hole 41 ejects a plasma forming gas from the center side toward the peripheral side of the rotary table 12, and the gas ejection hole 42 ejects, for example, $H_2$ gas and $NH_3$ gas, and Ar gas, which is a purge gas, from the peripheral side toward the center side of the rotary table 12. In the drawing, reference numeral 43 denotes an $H_2$ gas supply source, reference numeral 44 denotes an $NH_3$ gas supply source, and reference numeral 46 denotes a purge gas supply source. The gas ejection hole 41 and the gas ejection hole 42 are connected to the $H_2$ gas supply source 43 and the $NH_3$ gas supply source 44, respectively, via a piping system 40 including a gas supply device 45.

In the plasma forming unit 3A, microwaves supplied to the waveguide 33 pass through the slot holes 36A in the slot plate 36, and plasmatize $NH_3$ gas, $H_2$ gas, or a mixture thereof ejected below the dielectric plate 32. Further, lower portions of the plasma forming units 3A to 3C correspond to the processing regions R1 to R3, respectively, and the plasma forming units 3A to 3C correspond to reaction gas supply parts, respectively. In addition, in the film forming apparatus according to the present embodiment, both the first reaction gas and the second reaction gas use plasmatized $NH_3$ gas. Therefore, in this example, the first reaction gas and the second reaction gas are common. In addition, below an outer side of the rotary table 12 in the vacuum container 11 and outside the plasma forming unit 3B, a second exhaust port 51 opens and is connected to a vacuum exhaust part 50. That is, it can be said that the second exhaust port 51 is provided to be spaced apart from the surrounding region RA in the circumferential direction of the rotary table 12.

As illustrated in FIG. 1, the film forming apparatus 1 is provided with a controller 10 configured with a computer, and the controller 10 stores a program. With respect to the program, a group of steps is configured such that a control signal is transmitted to each part of the film forming apparatus so as to control the operation of each part, and pre-processing is executed before performing a film forming process and maintenance described below. Specifically, the number of rotations of the rotary table 12 by the rotation mechanism 13, the power supply to the heater 15, the supply of each gas, the exhaust of the vacuum container 11, and the like are controlled by, for example, a film forming program for performing a film forming process and a program for executing pre-processing before maintenance. These programs are installed in the controller 10 from a storage medium, such as a hard disk, a compact disc, a magneto-optical disc, or a memory card.

Figure 5:
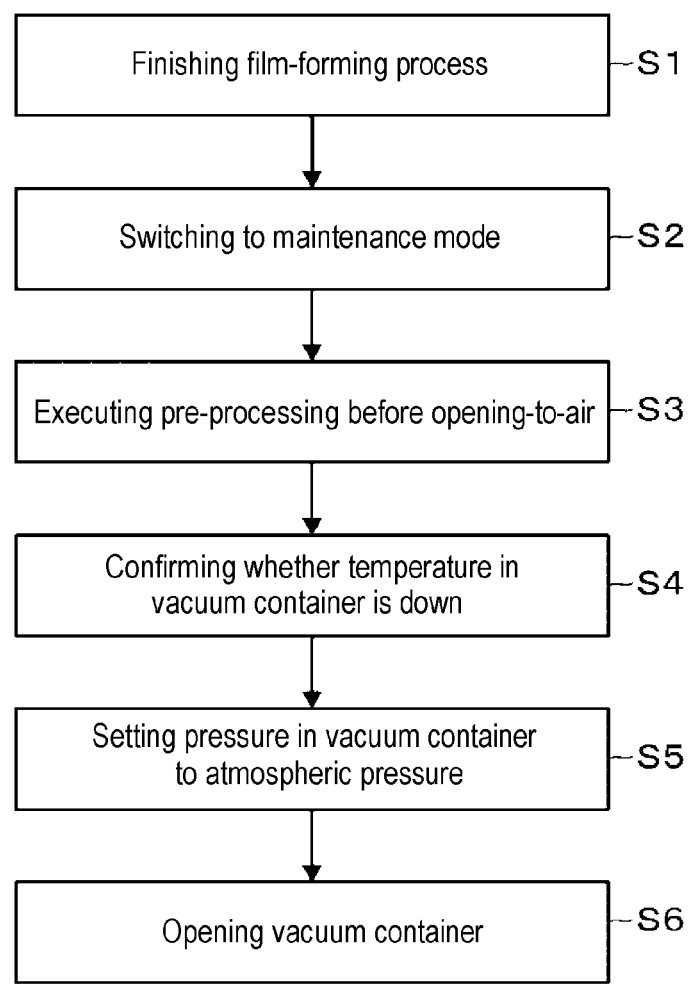
FIG. 5 is a flowchart illustrating operation processes of the film forming apparatus.

Next, the operation of the film forming apparatus according to the present disclosure will be described. For example, in a film forming apparatus for forming a SiN film on the wafer W, the SiN film may be formed on an inner surface of the vacuum container 11 during the film forming process. When the film formed on the inner surface of the vacuum container 11 becomes thicker, the film attached to the inner surface of the vacuum container 11 may peel off to generate particles due to film stress caused by, for example, a temperature change in the vacuum container 11. Therefore, in the film forming apparatus, for example, each time a predetermined number of wafers W are processed, the film forming apparatus is opened to the air so as to perform maintenance such as removal of a film attached to the inside of the vacuum container 11 and replacement of components constituting the apparatus. FIG. 5 is a flowchart illustrating the transition from a film forming process to opening the vacuum container 11 to the air for maintenance.

First, the film forming apparatus is set to a mode for executing a film forming program, and performs a film forming process on wafers W, for example, until a predetermined number of processed wafers is reached (step S1). Referring to the film forming process, for example, a gate valve provided at the transport port 16 in the vacuum container 11 is opened first. Thereafter, six wafers W are transported by the substrate transport mechanism provided in the vacuum transport chamber and are delivered to the respective recesses 14 in the rotary table 12 by the cooperation of the lifting pins and the substrate transport mechanism.

When the wafers W are delivered to respective recesses 14, the gate valve is closed so as to make the inside of the vacuum container 11 airtight. The wafers W placed on the recesses 14 are heated by the heater 7 to, for example, 250 degrees C. or higher, such as, for example, 550 degrees C. Then, as illustrated in FIG. 6, by evacuation from the second exhaust port 51, a vacuum atmosphere having a pressure of, for example, 2 torr (266.6 Pa), is formed inside the vacuum container 11, and the rotary table 12 rotates clockwise at a rotation speed of, for example, 20 rpm.

In addition, $H_2$ gas is supplied to each of the processing regions R1 and R2, and $NH_3$ gas and $H_2$ gas are supplied to the processing region R3. While each gas is supplied as described above, microwaves are supplied to each of the processing regions R1 to R3 by respective plasma forming units 3A to 3C. By the microwaves, plasma of $H_2$ gas is formed in each of the processing regions R1 and R2, and plasma of $H_2$ gas and $NH_3$ gas is formed in the processing regions R3. In the gas supply and exhaust unit 2, DCS gas is ejected from the gas ejection ports 21. In addition, a purge gas (Ar) gas is ejected from the purge gas ejection port 23, and the first exhaust port 22 exhausts the gas.

Figure 6:
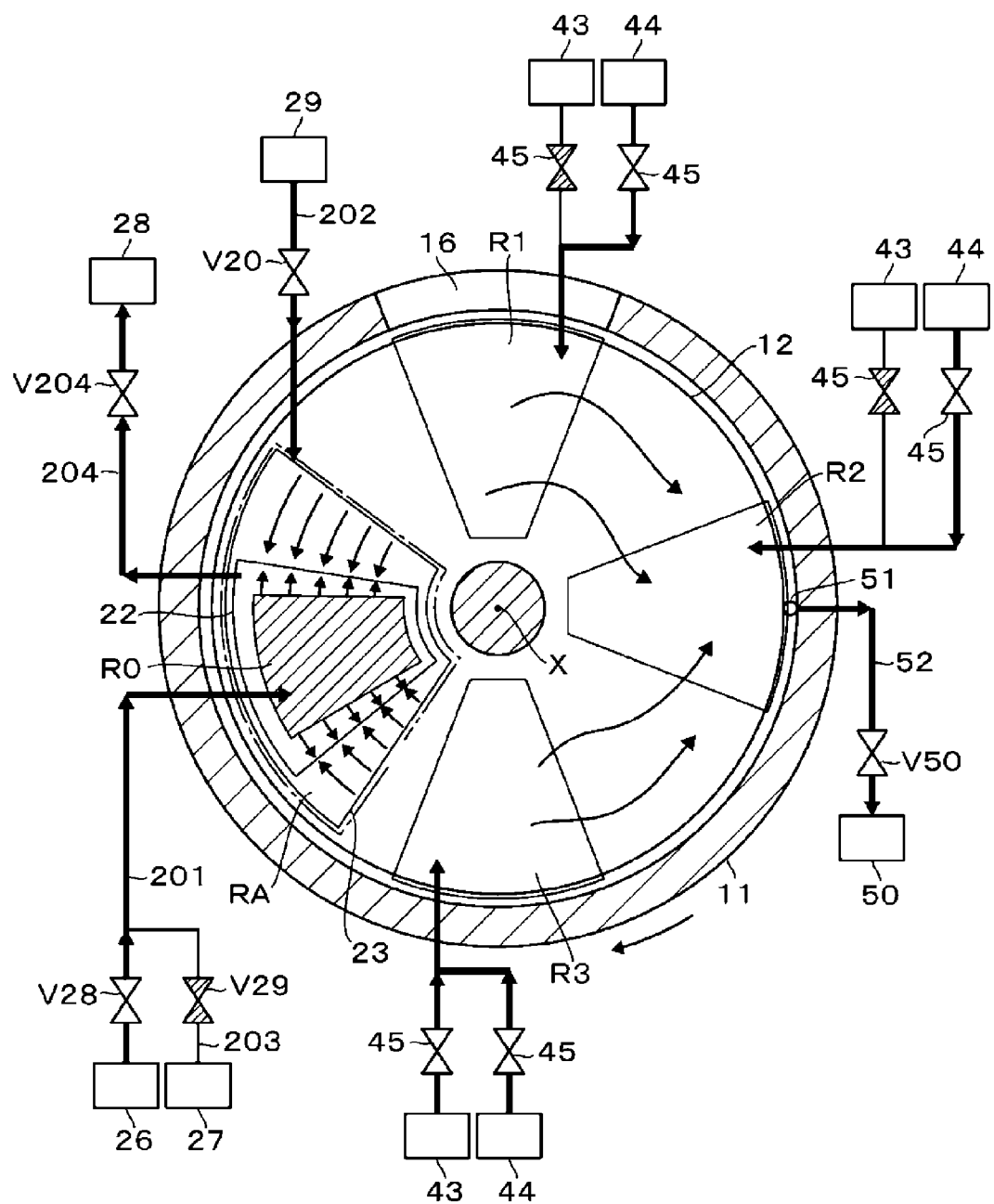
FIG. 6 is an explanatory diagram illustrating a gas flow in a vacuum container in a film forming process.

At this time, as illustrated in FIG. 6, the adsorption region R0 and an outside of the adsorption region R0 are partitioned by the purge gas supplied from the purge gas ejection port 23 and the first exhaust port 22 provided so as to surround the adsorption region R0. Therefore, the DCS gas supplied from the gas ejection ports 21 is supplied only to the adsorption region R0. In the vacuum container 11, plasmatized $H_2$ gas is supplied to the processing regions R1 and R2, and plasmatized $H_2$ gas and plasmatized $NH_3$ gas are supplied to the processing region R3. The plasmatized $H_2$ gas and the plasmatized $NH_3$ gas are partitioned by the purge gas supplied from the outer edge of the surrounding region RA and the exhaust of the first exhaust port 22, and flow toward the second exhaust port 51 side so as to be exhausted.

Then, when each wafer W is located in the adsorption region R0 by rotating the rotary table 12 so as to make each wafer W revolve, the DCS gas is supplied and adsorbed to the surface of the wafer W. When the rotary table 12 is further rotated and thus the wafer W reaches the processing region R3, the DCS adsorbed on the wafer W reacts with $NH_3$ so as to generate SiN as a first reaction product. In this example, when the wafer W passes below the processing regions R1 to R3, the active species of hydrogen formed by plasmatizing $H_2$ are supplied to the wafer W, and chlorine (Cl) remaining on the wafer W is removed. By continuing the rotation of the rotary table 12 in this manner, the wafer W repeatedly passes through the adsorption region R0 and the processing regions R1 to R3 multiple times in sequence, SiN is deposited on the surface of the wafer W, and the thickness of the SiN film is increased. As a result, a SiN film is formed on the wafer W.

When the film forming process is performed in this manner, SiN will also be formed on the vacuum container 11 as described above and becomes a cause of particles. Thus, the vacuum container 11 is opened to the air and maintenance is performed in the film forming apparatus. In a film forming apparatus using a compound containing chlorine and elements other than chlorine, for example, DCS gas, as a source gas, Cl adheres and remains on the inner surface of the vacuum container 11, particularly around the gas ejection ports 21 on a bottom surface of the gas supply and exhaust unit 2. When the vacuum container 11 is opened to the air for maintenance, water contained in the air outside the film forming apparatus reacts with Cl adhering to the inside of the vacuum container 11, and, for example, HCl, which is a second reaction product, may be produced. In such a film forming apparatus, the bottom surface of the gas intake/exhaust unit 2 may be corroded by the HCl.

Therefore, in the film forming apparatus according to the present disclosure, in order to prevent HCl from being generated due to the reaction between Cl and moisture in the air, plasmatized $NH_3$ gas, which is a second reaction gas that reacts with Cl, is supplied into the vacuum container 11 before opening the vacuum container 11 to the air. As a result, the Cl reacts with the plasmatized $NH_3$, and ammonium chloride ($NH_4Cl$), which is a third reaction product, is generated.

Figure 7:
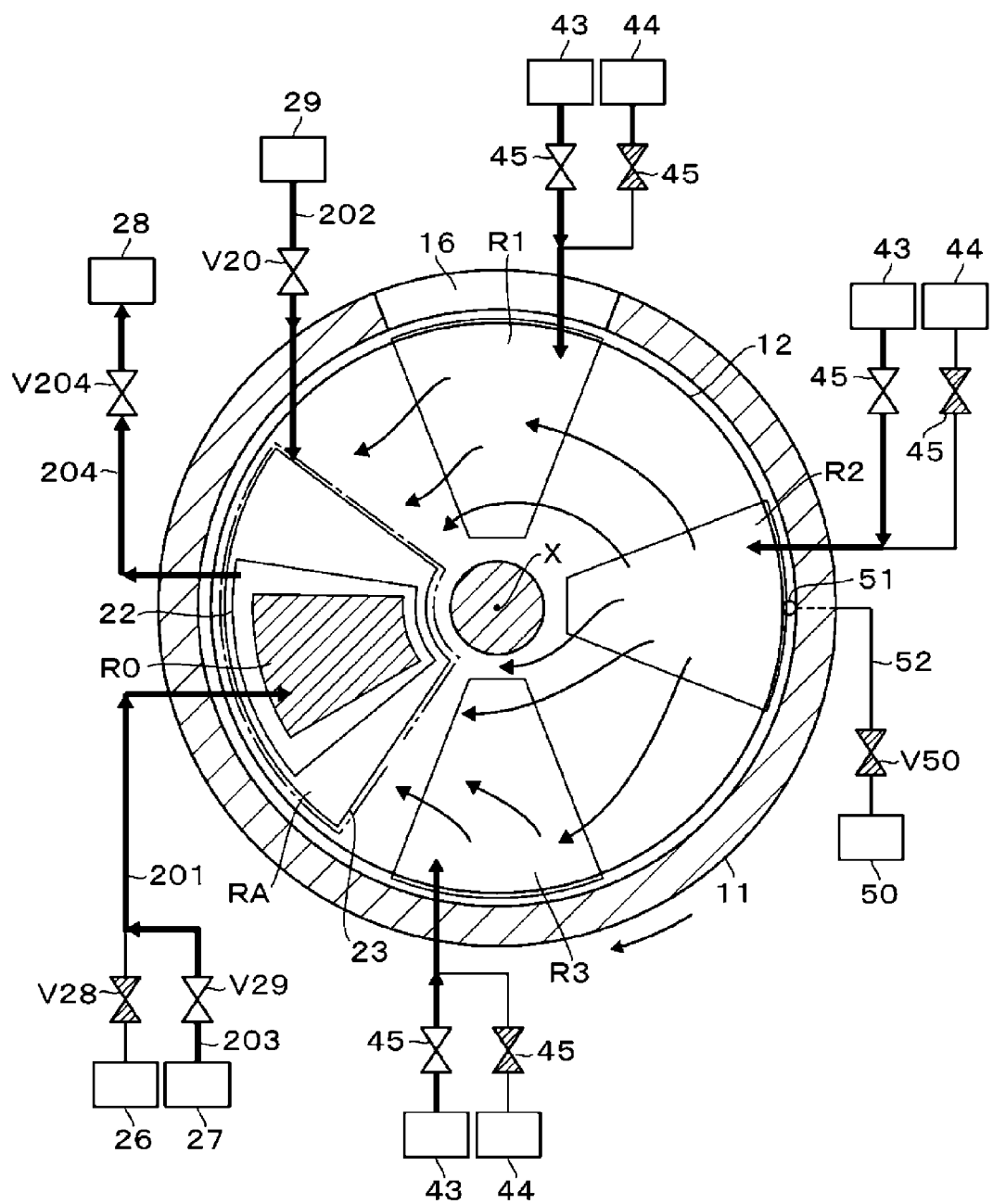
FIG. 7 is an explanatory diagram illustrating a gas flow in the vacuum container in a pre-processing process.

Returning to the flowchart of FIG. 5, when the film forming process is executed, for example, the film forming process for a predetermined number of processed wafers W is completed (step S1), the mode of the film forming apparatus is switched from a mode for the film forming process to a mode for performing pre-processing for maintenance (step S2). Thereafter, pre-processing before opening-to-air is executed (step S3). In the pre-processing, the heating temperature of the heater 15 is maintained at the processing temperature (550 degrees C.) during the film forming process, and first, the position of the rotary table 12 on which no wafer W is placed is returned to the initial position. Next, as illustrated in FIG. 7, $NH_3$ gas is supplied to the processing regions R1 to R3, while microwaves are supplied to the processing regions R1 to R3 by the plasma forming units 3A to 3C, respectively. As a result, the plasmatized $NH_3$ gas is supplied to each of the processing regions R1 to R3. In addition, the exhaust of the second exhaust port 51 is stopped. Further, the rotary table 12 is rotated at a rotation speed of 3 rpm.

In the gas supply and exhaust unit 2, the gas is exhausted from the first exhaust port 22, and the purge gas is ejected from the purge gas ejection port 23. Ar gas for backflow prevention is ejected from the gas ejection ports 21. The flow rates of the purge gas ejected from the purge gas ejection port 23 and the Ar gas ejected from the gas ejection ports 21 are set to amounts such that the backflow of gas is prevented. As a result, as illustrated in FIG. 7, the plasmatized $NH_3$ gas supplied into the vacuum container 11 flows toward the gas supply and exhaust unit 2 from below the plasma forming units 3A to 3C. In FIG. 7, arrows indicating the flow of the purge gas ejected from the gas ejection ports 21 and the purge gas ejection port 23 of the gas supply and exhaust unit 2 are omitted.

Figure 8:
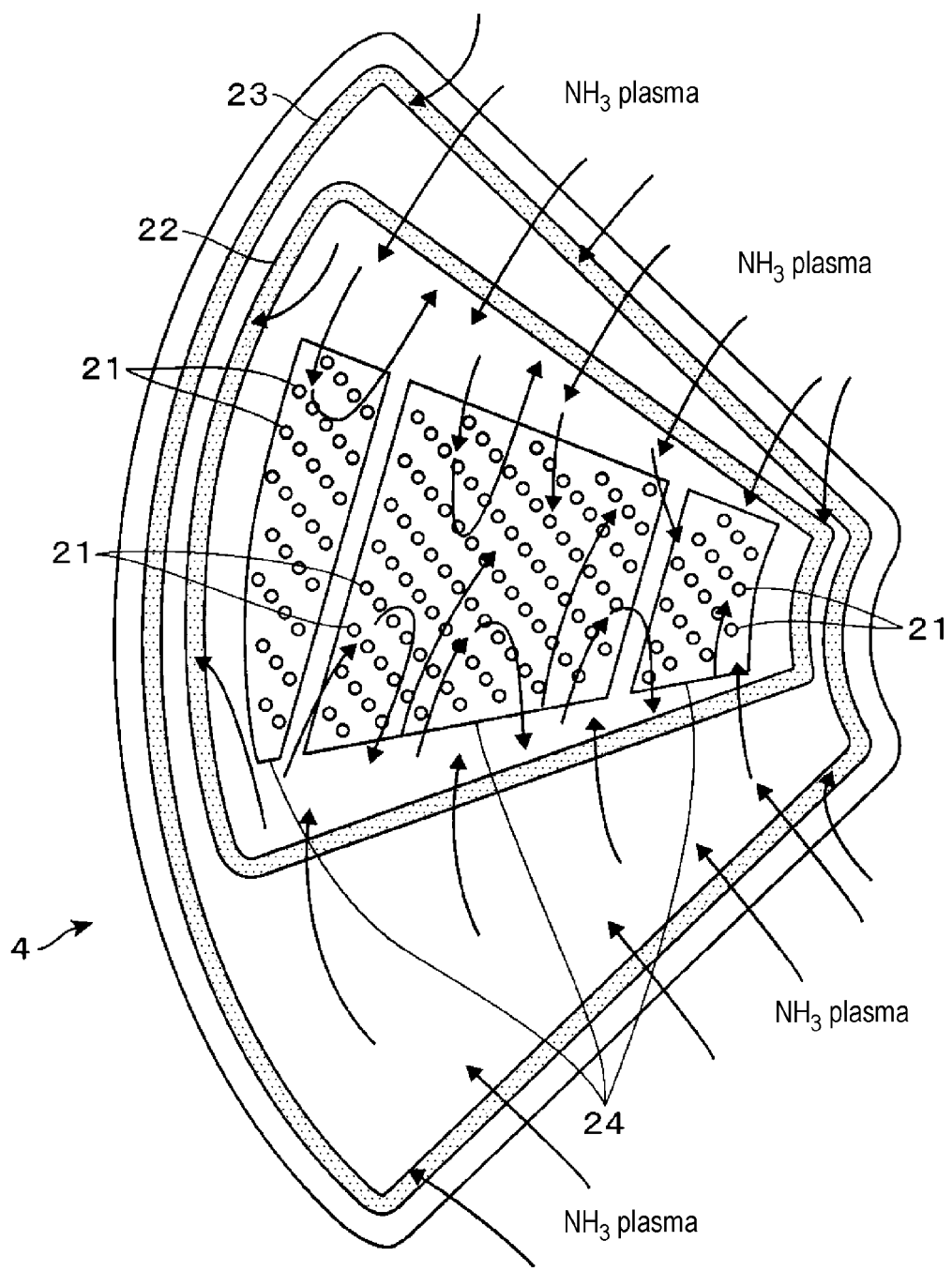
FIG. 8 is an explanatory diagram illustrating gas diffusion on a bottom surface of the gas supply and exhaust unit.

The plasmatized $NH_3$ gas that has reached below the gas supply and exhaust unit 2 is sent by diffusion, as illustrated in FIG. 8, or by rotation of the rotary table 2, and enters the adsorption region R0. Then, the $NH_3$ gas flows through the adsorption region R0 and is exhausted from the first exhaust port 22. In this way, the plasmatized $NH_3$ flows toward the first exhaust port 22 of the gas supply and exhaust unit 2 while being diffused in the vacuum container 11, and is supplied to the bottom surface side of the gas supply and exhaust unit 2 by diffusion. As a result, the plasmatized $NH_3$ gas is supplied to the Cl remaining in the vacuum container 11, particularly the Cl adhering to the vicinity of the gas ejection ports 21 of the gas supply and exhaust unit 2 in a large quantity, and the Cl and the plasmatized $NH_3$ react with each other to generate ammonium chloride ($NH_4Cl$), which is a third reaction product. Thereafter, $NH_4Cl$ is captured and removed by, for example, the exhaust flow flowing into the first exhaust port 22. Thereafter, for example, after supplying the plasmatized $NH_3$ gas for 10 minutes, the supply of the microwaves to the plasma forming units 3A to 3C is stopped and the supply of the $NH_3$ gas is stopped. Further, the rotary table 12 is stopped, and the temperature in the vacuum container 11 is further lowered to 40 degrees C.

Next, exhaust is performed from the first exhaust port 22 and the second exhaust port 51, the purge gas is intermittently ejected from the purge gas ejection port 23 and the gas ejection ports 21 in the gas supply and exhaust unit 2 and the plasma forming units 3A to 3C, and the cycle purge in the vacuum container 11 is performed. As a result, the plasmatized NH$_3$ gas remaining in the vacuum container 11 is removed. Returning to FIG. 5, after performing the pre-processing in this manner (step S3), the temperature inside the vacuum container is confirmed if it is lower than a preset temperature by, for example, a temperature detector provided inside the vacuum container 11. Further, for example, a purge gas is supplied from the gas supply and exhaust unit 2 and the plasma forming units 3A to 3C into the vacuum container 11 to raise the pressure in the vacuum container 11 to atmospheric pressure (step S5). Thereafter, the vacuum container 11 is separated from the vacuum transfer chamber, the ceiling plate 11B is removed from the container body 11A, the vacuum container 11 is opened to the air, and maintenance, such as replacement of members of the film forming apparatus and removal of attached substances, is performed.

As described above, by supplying plasmatized NH$_3$ gas to the Cl gas remaining in the vacuum container 11 to generate NH$_4$Cl, even when the vacuum container 11 is opened to the air and the air atmosphere containing water flows into the vacuum container 11, it is possible to suppress generation of HCl due to the reaction between water and Cl. As a result, it is possible to suppress corrosion of metal members that constitute the film forming apparatus.

The film forming apparatus according to the above-described embodiment is provided with the first exhaust port 22, which ejects the DCS gas to the adsorption region R0 while surrounding the adsorption region R0 on the rotary table 12. The film forming apparatus is configured to supply the plasmatized NH$_3$ gas to the processing regions R1 to R3 separated from the adsorption region R0, and the second exhaust port 51 is provided on the processing regions R1 to R3 side. In such a film forming apparatus, after performing the film forming process and before opening the vacuum container 11 to the air for maintenance of the film forming apparatus, the exhaust from the first exhaust port 22 is performed in the state in which the supply of the DCS gas is stopped, and plasmatized NH$_3$ gas is supplied to the processing regions R1 to R3. Therefore, NH$_3$ gas can be supplied toward the adsorption region R0 to which Cl is likely to adhere, to enter the adsorption region R0. Accordingly, the Cl adhering to the adsorption region R0 may react with the plasmatized NH$_3$ gas to form NH$_4$Cl. Thus, when the vacuum container 11 is opened to the air, generation of HCl due to the reaction between moisture in the air and the Cl remaining in the film forming apparatus can be suppressed, and corrosion of the metal members provided in the film forming apparatus can be suppressed.

Further, the film forming apparatus according to the present disclosure may use, for example, hexachlorodisilane as a reaction gas. In addition, primary and secondary amines may be used as a second reaction gas that is supplied in the pre-processing process to react with the Cl remaining in the vacuum container 11 so as to generate a third reaction product. Further, the second reaction gas is not limited to being plasmatized and supplied, and may be supplied after being activated by high-temperature or high-pressure processing. In addition, the element other than Cl contained in the source gas used for the film formation process is not limited to Si, and may be, for example, titanium. Further, as a film containing an element other than Cl, for example, a film containing titanium may be formed. The film containing an element other than Cl is a film containing an element other than Cl as a main component of the film, and does not mean that chlorine is included as an impurity in the film.

In the gas supply and exhaust unit 2 according to the present disclosure, each of the first exhaust port 22 and the purge gas ejection port 23 may have a configuration in which a plurality of holes are arranged in a row at positions corresponding to the inner edge and the outer edge of the surrounding region RA. In such a configuration, an arrangement obtained by interconnecting the holes that form the first exhaust port 22 corresponds to the inner edge of an atmosphere separation part RA, and an arrangement obtained by interconnecting the holes forming the purge gas ejection port 23 corresponds to the outer edge of an atmosphere separation part RA. Further, according to the present disclosure, in the pre-processing process, the NH$_3$ gas which is turned into plasma can enter the adsorption region R0 by diffusion even when the rotary table 12 is not rotated, but the rotary table 12 is rotated by rotating the rotary table 12, so that the NH$_3$ gas turned into plasma can be sent to the adsorption region R0 by rotation. Accordingly, it becomes easier to supply plasmatized NH$_3$ gas to the bottom surface of the gas supply and exhaust unit 2.

The phrase "the second exhaust port 51 is provided to be spaced apart from the surrounding region RA in the circumferential direction of the rotary table 12" means that the second exhaust port 51 is provided in a direction different from the direction in which the purge gas ejection port 23 exists when viewed from the rotation center X of the rotary table 12. The pre-processing process may be performed in a state in which the exhaust is performed from the second exhaust port 51. However, from the viewpoint of efficiently supplying the second reaction gas to the adsorption region R0 side, the exhaust flow rate in the second exhaust port 51 is preferably smaller than the exhaust flow rate in the first exhaust port 22. Further, the pre-processing process is more preferably performed by stopping the exhaust of the second exhaust port 51 and performing the exhaust only from the first exhaust port 22. At this time, a plurality of second exhaust ports 51 may be provided, in which case the exhaust flow rate is the total exhaust flow rate of the plurality of second exhaust ports 51. Further, the film forming apparatus according to the present disclosure may have a configuration in which two atmosphere separation parts that eject a separation gas in the radial direction of the rotary table 12 may be provided in the circumferential direction of the rotary table 12 so as to separate a first region and a second region, and a first exhaust port and a second exhaust port may be provided in the first region and the second region, respectively.

According to the present disclosure, it is possible to efficiently remove chlorine remaining in a film forming apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming apparatus that performs a cycle for sequentially supplying, to a substrate, a raw material gas, which is a compound containing chlorine and an element other than the chlorine, and a first reaction gas that reacts with the raw material gas so as to generate a first reaction product containing the element other than the chlorine, multiple times so as to form a film of the first reaction product, the film forming apparatus comprising:

a rotary table configured to rotate so as to make the substrate revolve within a vacuum container configured to allow opening-to-air for opening an inside thereof to an air atmosphere;

a raw material gas ejection port configured to eject the raw material gas to a first region on the rotary table;

a reaction gas supply part configured to supply, to a second region spaced apart from the first region in a circumferential direction of the rotary table, each of the first reaction gas and a second reaction gas that reacts with chlorine to generate a third reaction product, so as to prevent a second reaction product from being generated due to a reaction of the chlorine remaining in the vacuum container with air when performing the opening-to-air;

an atmosphere separation part configured to separate an atmosphere of the first region and an atmosphere of the second region when forming the film;

a first exhaust port and a second exhaust port configured to exhaust only the atmosphere of the first region and the atmosphere of the second region, respectively, when forming the film; and a controller configured to output a control signal for executing:

a film forming process of forming the film on the substrate by performing each of supplying the raw material gas and supplying the first reaction gas to the first region and the second region, respectively; and a pre-processing process performed before the opening-to-air so as to form a flow of the second reaction gas directed from the second region to the first exhaust port by performing exhaust from at least the first exhaust port of the first exhaust port and the second exhaust port and supplying the second reaction gas to the second region while rotating the rotary table, in a state in which the supply of the raw material gas to the first region is stopped after the film forming process, wherein the first exhaust port is an annular groove surrounding the first region and configured to evacuate an inner edge of a surrounding region surrounding the first region, while the second exhaust port is provided to be spaced apart from the surrounding region in a circumferential direction of the rotary table, and wherein a purge gas ejection port configured to eject a purge gas at an outer edge of the surrounding region and the first exhaust port constitute the atmosphere separation part.

2. The film forming apparatus of claim 1, wherein the first reaction gas and the second reaction gas are ammonia gas, the element other than the chlorine is silicon, and the film of the first reaction product is a silicon nitride film.

3. The film forming apparatus of claim 2, further comprising:

a plasmatizing mechanism configured to plasmatize the first reaction gas and the second reaction gas supplied to the second region, wherein the first reaction gas and the second reaction gas are a plasmatized ammonia gas.

4. The film forming apparatus of claim 3, wherein an exhaust flow rate from the second exhaust port in the pre-processing process is smaller than an exhaust flow rate from the first exhaust port in the film forming process.

5. The film forming apparatus of claim 4, wherein the exhaust from the second exhaust port is stopped in the pre-processing process.

6. The film forming apparatus of claim 5, wherein a flow rate of the purge gas supplied from the purge gas ejection port in the pre-processing process is smaller than a flow rate of the purge gas supplied from the purge gas ejection port in the film forming process.

7. The film forming apparatus of claim 1, wherein an exhaust flow rate from the second exhaust port in the pre-processing process is smaller than an exhaust flow rate from the first exhaust port in the film forming process.

8. The film forming apparatus of claim 1, wherein a flow rate of the purge gas supplied from the purge gas ejection port in the pre-processing process is smaller than a flow rate of the purge gas supplied from the purge gas ejection port in the film forming process.

9. The film forming apparatus of claim 1, further comprising:

a purge gas supply mechanism configured to perform ejection of a purge gas to the first region from the raw material gas ejection port and ejection of the purge gas to the second region after the pre-processing process, wherein the controller is configured to output a control signal such that the purge gas is ejected to each of the first region and the second region after the pre-processing process.

* * * * *